United States Patent
Marokkey et al.

(10) Patent No.: US 7,666,800 B2
(45) Date of Patent: Feb. 23, 2010

(54) FEATURE PATTERNING METHODS

(75) Inventors: Sajan Marokkey, Wappingers Falls, NY (US); Alois Gutmann, Poughkeepsie, NY (US); Klaus Herold, Poughquag, NY (US); Chandrasekhar Sarma, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 105 days.

(21) Appl. No.: 12/030,810

(22) Filed: Feb. 13, 2008

(65) Prior Publication Data

US 2009/0200583 A1    Aug. 13, 2009

(51) Int. Cl.
H01L 21/31        (2006.01)
H01L 21/469      (2006.01)

(52) U.S. Cl. ............... 438/769; 438/311; 438/712; 438/733; 257/E21.032; 257/E21.054; 257/E21.058; 257/E21.218; 257/E21.231; 257/E21.267; 257/E21.304

(58) Field of Classification Search ............ 438/311, 438/445, 671, 618, 687, 692, 637, 700, 717, 438/725, 733, 769, 712, 622
See application file for complete search history.

(56) References Cited

U.S. PATENT DOCUMENTS

| | | | |
|---|---|---|---|
| 2003/0003716 A1* | 1/2003 | Kim | 438/638 |
| 2006/0240361 A1 | 10/2006 | Lee et al. | |
| 2006/0292834 A1* | 12/2006 | Lin et al. | 438/478 |
| 2007/0075359 A1* | 4/2007 | Yoon et al. | 257/329 |
| 2007/0122968 A1* | 5/2007 | Sim et al. | 438/243 |
| 2007/0210334 A1* | 9/2007 | Lim et al. | 257/200 |
| 2008/0087948 A1* | 4/2008 | Kim | 257/330 |

OTHER PUBLICATIONS

Hand, A., "Applied's Litho Scheme: Patterning vs. Printing," Semiconductor International, http://www.reed-electronics.com/semiconductor/article/CA6428429?industryid=3030, Apr. 1, 2007, pp. 1-3, Reed Business Information, Oak Brook, IL.

* cited by examiner

*Primary Examiner*—David Nhu
(74) *Attorney, Agent, or Firm*—Slater & Matsil, L.L.P.

(57) ABSTRACT

Methods of patterning features of semiconductor devices and methods of processing and fabricating semiconductor devices are disclosed. In one embodiment, a method of processing a semiconductor device includes forming first sidewall spacers on a first hard mask, removing the first hard mask, and forming a first material layer over the first sidewall spacers. A second hard mask is formed over the first material layer and the first sidewall spacers. Second sidewall spacers are formed on the second hard mask, and the second hard mask is removed. At least the first sidewall spacers are patterned using the second sidewall spacers as a mask.

24 Claims, 9 Drawing Sheets

FEATURE PATTERNING METHODS

TECHNICAL FIELD

The present invention relates generally to the fabrication of semiconductor devices, and more particularly to patterning features of semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

There is a trend in the semiconductor industry towards reducing the size of features, e.g., the circuits, elements, conductive lines, vias, and contacts, of semiconductor devices, in order to improve the performance of the semiconductor devices, reduce power consumption, and meet smaller packaging requirements, for example. However, as feature sizes of semiconductor devices diminish, the patterning of features becomes more challenging. The transfer of patterns of lithography masks to semiconductor devices having small feature sizes may be inaccurate or unpredictable in some applications, for example. Furthermore, minimum feature sizes are limited based on resolution limits of lithography systems, processes, and materials used in lithography, for example.

Thus, what are needed in the art are improved methods of patterning features of semiconductor devices.

SUMMARY OF THE INVENTION

These and other problems are generally solved or circumvented, and technical advantages are generally achieved, by preferred embodiments of the present invention, which provide novel methods of patterning features of semiconductor devices, and methods of processing and fabricating semiconductor devices.

In accordance with one embodiment of the present invention, a method of processing a semiconductor device includes forming first sidewall spacers on a first hard mask, removing the first hard mask, and forming a first material layer over the first sidewall spacers. A second hard mask is formed over the first material layer and the first sidewall spacers. Second sidewall spacers are formed on the second hard mask, and the second hard mask is removed. At least the first sidewall spacers are patterned using the second sidewall spacers as a mask.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise

DETAILED DESCRIPTION OF ILLUSTRATIVE EMBODIMENTS

Figure 1:
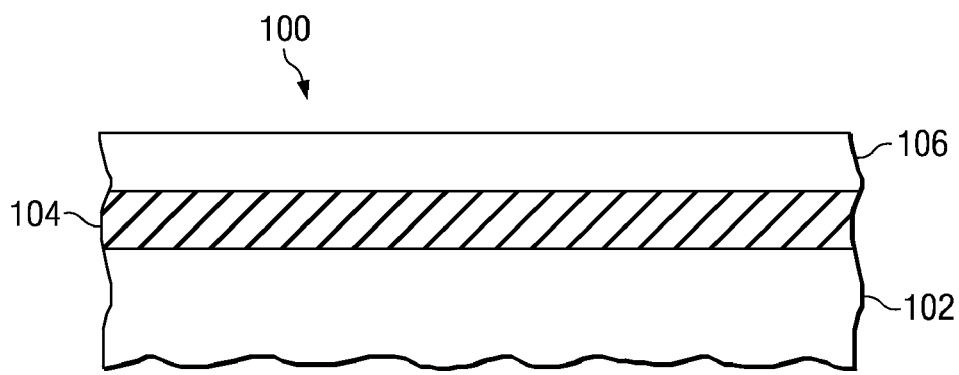
FIGS. 1 through 3 show cross-sectional views of a semiconductor device at various stages of manufacturing, wherein first sidewall spacers are formed on sidewalls of a first hard mask.

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Metallization layers are usually the top-most material layers of semiconductor devices. The manufacturing of semiconductor devices is typically classified into two phases, the front end of line (FEOL) and the back end of line (BEOL). The BEOL is typically considered to be the point of the manufacturing process where metallization layers are formed, and the FEOL is considered to include the manufacturing processes prior to the formation of the metallization layers.

While some integrated circuits have a single top layer of metallization, other integrated circuits comprise multi-level interconnects, wherein two or more metallization layers are formed over a semiconductor wafer or workpiece. Each conductive line layer typically comprises a plurality of conductive lines separated from one another by an insulating material, also often referred to as an inter-level dielectric (ILD). The conductive lines in adjacent horizontal metallization layers may be connected vertically in predetermined places by vias formed between the conductive lines. The first metallization layer in a multi-level interconnect scheme is often referred to as a contact layer, for example.

Damascene processes are often used to form conductive features in metallization layers, e.g., if the conductive features comprise copper, in particular, which is difficult to subtractively etch. In a damascene process, a material such as a dielectric or insulator is deposited over a wafer, and then the material is patterned with a conductive feature pattern. The conductive feature pattern typically comprises a plurality of trenches (for conductive lines), or apertures (for vias), for example. The trenches or apertures are then filled in with conductive material, and a chemical-mechanical polish (CMP) process and/or etch process is used to remove the excess conductive material from the top surface of the patterned material. The conductive material remaining within the patterned material comprises conductive features such as conductive lines and/or vias.

Damascene processes are typically either single or dual damascene. In a single damascene process, one metallization layer is formed at a time. In a dual damascene process, two adjacent horizontal metallization layers are patterned, e.g., by forming two lithography patterns in two insulating material layers such as dielectric layers or in a single insulating material layer. The two patterns are then filled in with conductive material, and a CMP process is used to remove excess conductive material from over the insulating material, leaving patterned conductive material in the insulating material layers. For example, the patterns may comprise trenches for conductive lines in one insulating material layer portion and apertures for vias in the underlying insulating material layer portion. Thus, in a dual damascene process, conductor trenches and via apertures are filled in one fill step.

The present invention will be described with respect to preferred embodiments in a specific context, namely in the patterning of contacts, vias, or other conductive features of semiconductor devices using damascene processes. The invention may also be applied, however, to the patterning of other features of semiconductor devices, particularly features having a repeating pattern and comprising small sizes, e.g., that may be close to or limited by the resolution limits of the lithography system, processes, and photosensitive materials used to pattern the device features. Embodiments of the present invention may also be used to form features comprising other materials, such as semiconductive or insulating materials, or other materials combined with conductive materials. Embodiments of the invention may be implemented in semiconductor applications such as transistors, memory devices, logic devices, mixed signal devices, and other applications, as examples.

Embodiments of the present invention provide novel methods for patterning features of a semiconductor device using four sacrificial material layers. Two hard masks are used to form two sets of sidewall spacers positioned over one another in two different directions, viewed from a top surface of a workpiece. An optional trim mask may be used to remove portions of the upper set of sidewall spacers, uncovering a portion of the lower sidewall spacers, in some embodiments. The upper set of sidewall spacers is used as a mask to pattern the lower set of sidewall spacers. Insulating materials are formed around the patterned lower sidewall spacers. The patterned lower sidewall spacers are used to define a pattern for features in the insulating materials. The features are then formed in the insulating materials using a damascene process, or the insulating materials are used as a hard mask to pattern an underlying material layer in which features are formed using a damascene process. Advantageously, feature sizes are achievable that are less than a minimum feature size of a lithography system or process, for example.

Figure 2:
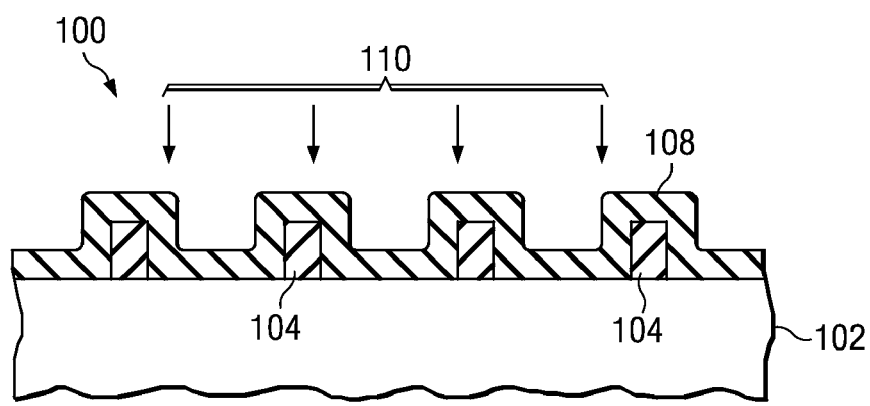
Figure 3:
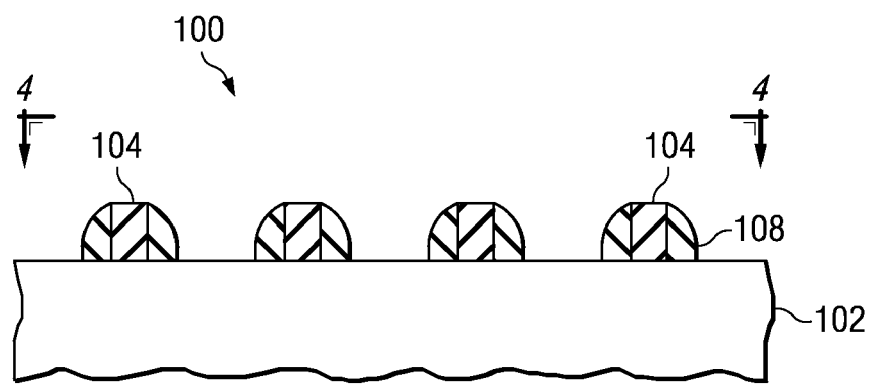

FIGS. 1 through 17 show cross-sectional and top views of a semiconductor device 100 at various stages of manufacturing in accordance with an embodiment of the present invention. FIGS. 1 through 3 show cross-sectional views of the semiconductor device 100, wherein first sidewall spacers 108 are formed on sidewalls of a first hard mask 104. Referring first to FIG. 1, to manufacture the device 100, a workpiece 102 is provided. The workpiece 102 may include a semiconductor substrate or body comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate, for example.

A first hard mask material 104 is formed over the workpiece 102. The first hard mask material 104 may comprise an insulating material, a semiconductive material, or multiple layers or combinations thereof, for example. The first hard mask material 104 may comprise silicon dioxide, silicon nitride, silicon oxynitride, other oxide or nitride materials, polysilicon, amorphous or crystalline silicon, one or more etch stop layers, or multiple layers or combinations thereof, as examples. The first hard mask material 104 may comprise other masking materials such as Advanced Patterning Film (APF) available from Applied Materials, or other commercially available masking materials, for example. The first hard mask material 104 may comprise a thickness of about 100 to 500 nm, as an example, although alternatively, the first hard mask material 104 may comprise other dimensions. The first hard mask material 104 is also referred to herein as a first sacrificial material, for example. The first hard mask material 104 preferably comprises a material that is adapted to be etched selective to the material of the top surface of the workpiece 102 and to the material of subsequently formed first sidewall spacers 108 (see FIG. 3), for example. In some embodiments, the first hard mask material 104 comprises an oxide material.

A layer of photosensitive material 106 is formed over the first hard mask material 104, for example, as shown in FIG. 1. The layer of photosensitive material 106 may comprise a photoresist, for example. An anti-reflective coating (ARC), not shown, may be formed over the first hard mask material 104 before depositing the layer of photosensitive material 106, for example.

The layer of photosensitive material 106 is patterned with a first pattern for a plurality of lines extending in a first direction, e.g., in a top view of the workpiece 102. The plurality of lines of the first pattern may each comprise a minimum feature size of a lithography system, lithography process, or of the layer of photosensitive material 106, as examples, although alternatively, the plurality of lines of the first pattern may comprise other dimensions, for example. The lines may comprise a width of about 32 to 50 nm in some applications, for example, although the lines may comprise a width of greater than about 50 nm or less than about 32 nm, for example. Over time the minimum feature size or ground rule is expected to be reduced, and older technologies may have larger minimum feature sizes, for example.

The layer of photosensitive material 106 may be patterned using a first lithography mask (not shown), by transferring a pattern in the first lithography mask to the layer of photosensitive material 106 by exposing the layer of photosensitive material 106 to energy passed through or reflected from the first lithography mask, for example. Alternatively, the layer of photosensitive material 106 may be patterned using a direct patterning method, using a direct-write e-beam system, as another example.

The layer of photosensitive material 106 is used as an etch mask to pattern the first hard mask material 104, and the layer of photosensitive material 106 is then removed, leaving the patterned first hard mask 104 shown in FIG. 2. The width of the lines extending in the first direction in a top view of the patterned first hard mask 104 may comprise about 100 nm or less, for example, although alternatively, the width of the lines may comprise other dimensions. The lines may extend in the y direction in a top view of the workpiece 102 (not shown in FIG. 2; see FIG. 4) by about several hundred nm to several µm, depending on the semiconductor device 100 design, for example, although alternatively, the lines of the patterned first hard mask 104 may comprise other dimensions.

Next, a first sidewall spacer material 108 is formed over the patterned first hard mask 104, as shown in FIG. 2. The first sidewall spacer material 108 is also referred to herein as a second sacrificial material, for example. The first sidewall spacer material 108 may comprise silicon dioxide, silicon nitride, silicon oxynitride, other oxides or nitrides, a semiconductive material, one or more etch stop layers, or multiple layers or combinations thereof, as examples. The first sidewall spacer material 108 may comprise a thickness of about 300 nm or less, for example, although alternatively, the first sidewall spacer material 108 may comprise other dimensions. The first sidewall spacer material 108 preferably comprises a material that is adapted to be etched selective to the material of the top surface of the workpiece 102 and to the material of the first hard mask 104 at the top surface of the first hard mask 104, for example. In embodiments wherein the first hard mask 104 comprises an oxide material, the first sidewall spacer material 108 may comprise a nitride material, for example.

The first sidewall spacer material 108 may be substantially conformal as deposited, as shown, in some embodiments. Alternatively, the first sidewall spacer material 108 may completely cover the spaces between the patterned first hard mask 104 and may extend over the top surface of the first hard mask 104, for example, not shown, in other embodiments.

The first sidewall spacer material 108 is etched using an etch process 110 as shown in FIG. 2, forming first sidewall spacers 108 on sidewalls of the first hard mask 104, as shown in FIG. 3. The etch process 110 may comprise a directional or anisotropic etch process adapted to preferentially remove the first sidewall spacer material 108 from top surfaces of the first hard mask 104 and the workpiece 102, yet leaving a portion of the first sidewall spacer material 108 on sidewalls of the first hard mask 104, forming the first sidewall spacers 108, for example.

The sides of the first sidewall spacers 108 slope downwardly away from the top surface of the first hard mask 104 due to the etch process 110, wherein the bottom of the first sidewall spacers 108 is slightly wider than the top of the first sidewall spacers 108. The first sidewall spacers 108 may comprise a width of about 100 nm or less, and may comprise a width of about 50 nm or less in some embodiments, although alternatively, the first sidewall spacers 108 may comprise other dimensions. The first sidewall spacers 108 may comprise a width of less than about 32 nm in some embodiments, for example.

A first optional reactive ion etch (RIE) trim etch process may be used to reduce the thickness of the first sidewall spacers 108 on sidewalls of the first hard mask 104, for example. The width in a top view of the first sidewall spacers 108 may be decreased by about 10 nm or less in some embodiments using the first optional RIE trim etch process, for example. The first optional RIE trim etch process may comprise a timed etch process of a few seconds or minutes, for example. Because the first sidewall spacers 108 are used to define sides of features (see features 140 in FIG. 17) parallel to the first direction y, the first optional RIE trim etch process advantageously reduces the size of the sidewall spacers 108, also reducing the size of features 140 patterned using the novel methods of embodiments of the present invention.

Figure 4:
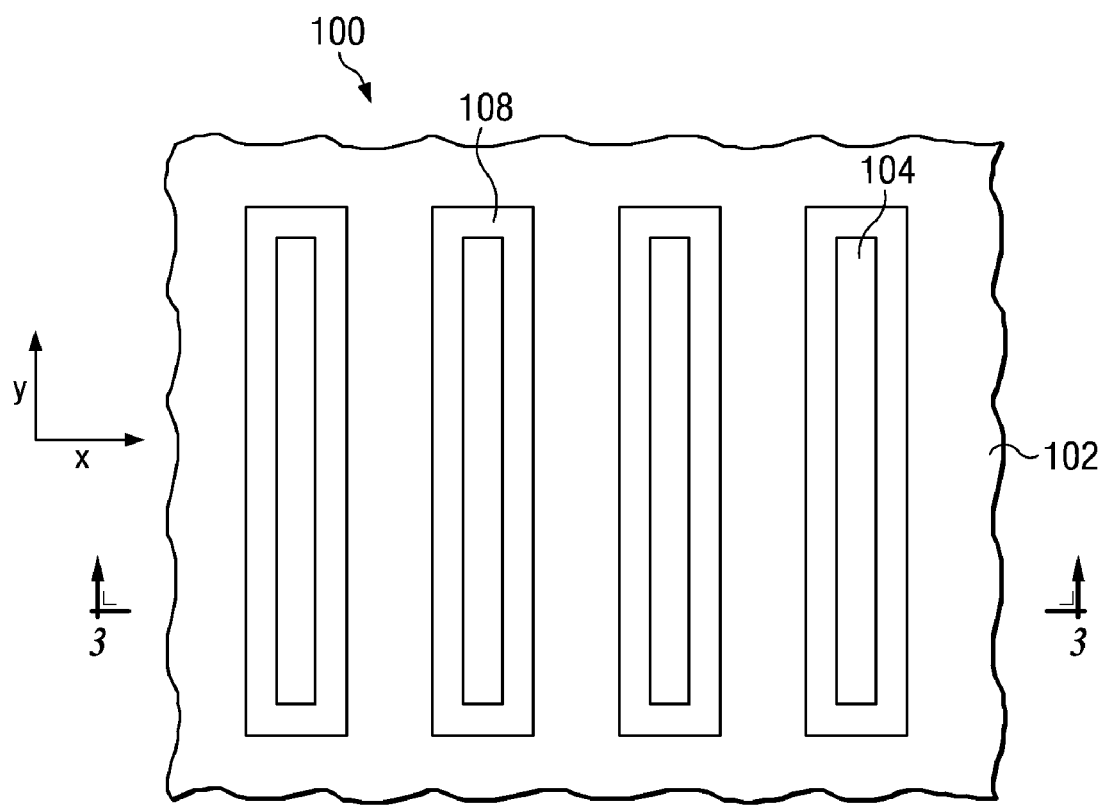
FIG. 4 shows a top view of the semiconductor device shown in FIG. 3.

FIG. 4 shows a top view of the semiconductor device 100 shown in FIG. 3. The first hard mask 104 comprises the shape of a plurality of lines that extend in a first direction, e.g., in the y direction. The first sidewall spacers 108 comprise a ring-shaped spacer material disposed around each of the lines of the first hard mask 104.

Figure 5:
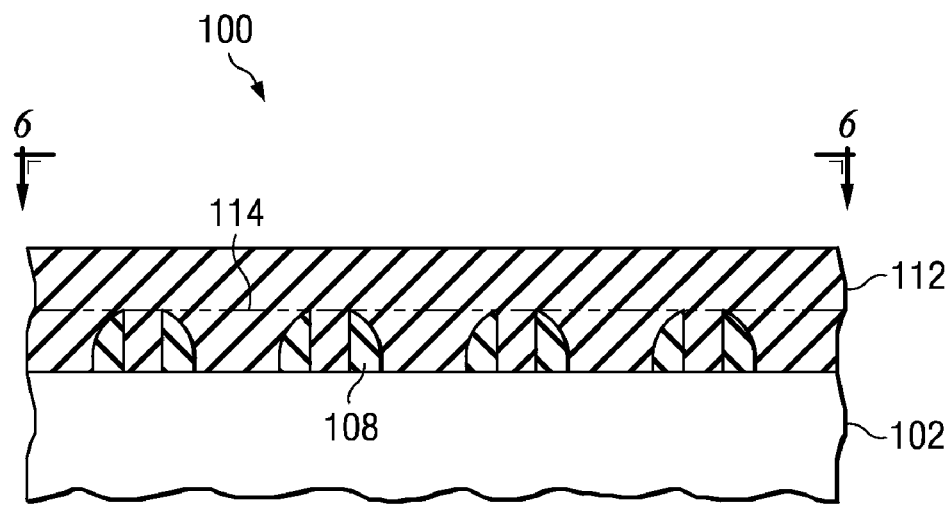
FIG. 5 shows a cross-sectional view of the semiconductor device shown in FIGS. 3 and 4 at a further stage of manufacturing, after the first hard mask is removed and after a first material layer has been formed between the first sidewall spacers.

Next, the first hard mask 104 is removed, e.g., using an etch process, and a first material layer 112 is formed over the workpiece 102, as shown in FIG. 5, which shows a cross-sectional view of the semiconductor device 100 shown in FIGS. 3 and 4 after the formation of the first material layer 112. The first material layer 112 is formed between the first sidewall spacers 108. The first material layer 112 may be formed over the top surfaces of the first sidewall spacers 108 as deposited, as shown. A CMP process and/or etch process may be used to planarize the first material layer 112 to a level 114 that is substantially coplanar with the top surfaces of the first sidewall spacers 108. The planarization process may expose a top portion of the first sidewall spacers 108 in some embodiments, for example. Alternatively, the first material layer 112 may be formed using a process that results in the first material layer 112 being formed between the first sidewall spacers 108 to a height or level 114 that is substantially the same as the top surfaces of the first sidewall spacers 108, for example, using a spin-on process.

The first material layer 112 comprises an insulating material in some embodiments, such as silicon dioxide, although other insulating materials may also be used. The first material layer 112 is also referred to herein as a first insulating material layer, for example. The first material layer 112 may comprise an oxide for a contact layer of a semiconductor device 100 in some embodiments, for example.

In other embodiments, the first material layer 112 may comprise a hard mask material, for example, that will later be used to pattern an underlying material layer of the semiconductor device 100. The first material layer 112 may comprise insulating materials, conductive or semiconductive materials, or conductive or semiconductive materials combined with insulating materials, as examples. The first material layer 112 may comprise at least one conductive material layer, at least one semiconductive material layer, at least one insulating material layer, or combinations or multiple layers thereof.

In embodiments wherein the first hard mask 104 comprises an oxide material and the first sidewall spacers 108 comprise a nitride material, the first material layer 112 may comprise an oxide material, for example.

Figure 6:
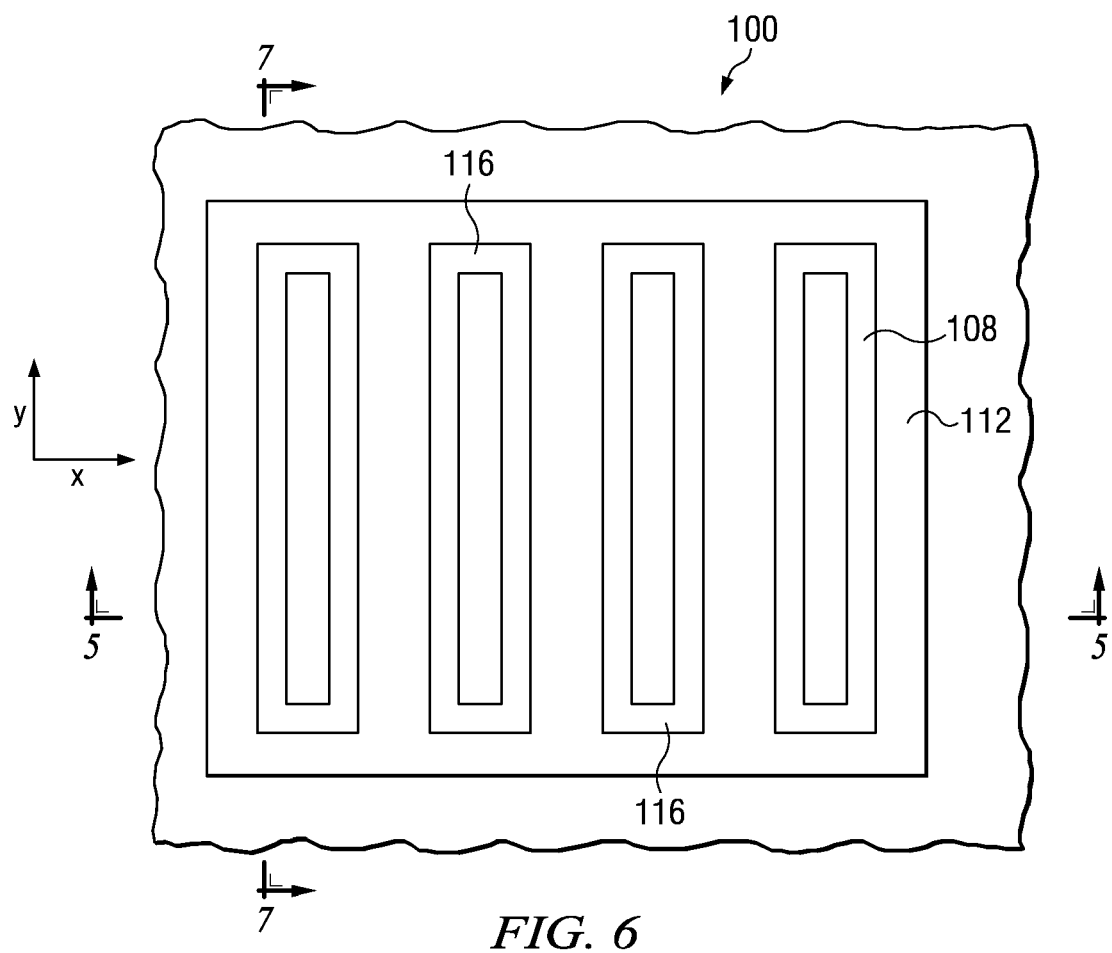
FIG. 6 shows a top view of the semiconductor device shown in FIG. 5.

FIG. 6 shows a top view of the semiconductor device 100 shown in FIG. 5. In accordance with some embodiments of the present invention, at least a portion of the first sidewall spacers 108 is visible in a top view of the device 100, as shown. Because a planarization process may be used to planarize the first material layer 112, tips of the first sidewall spacers 108 may extend through the top surface of the first material layer 112, for example. Note that the first sidewall spacers 108 that were formed over the lines of the first hard mask 104 comprise spacer rings that extend lengthwise and have ends 116 that were disposed over and adjacent the ends of the first hard mask 104 lines, for example.

Figure 7:
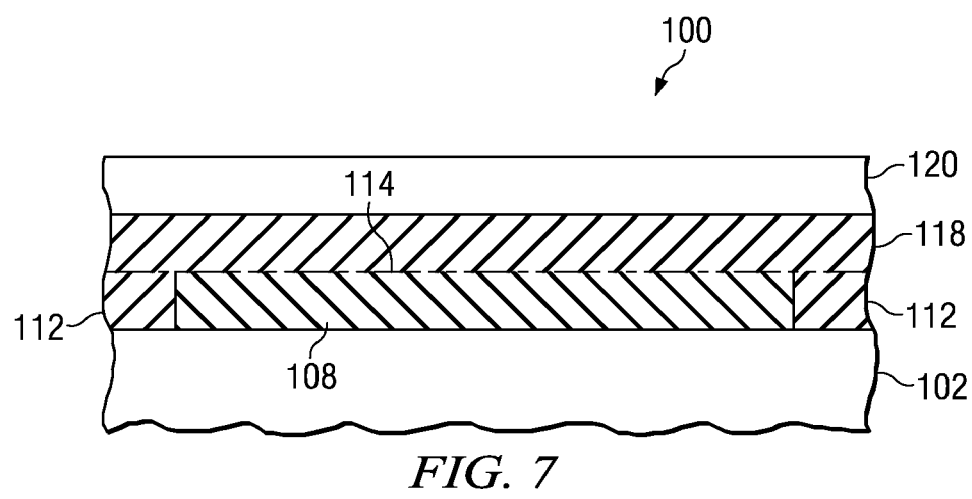
FIG. 7 shows a cross-sectional view of the semiconductor device shown in FIG. 6 in a view perpendicular to the view shown in FIG. 5 after a second hard mask material and a photosensitive material have been formed over the first sidewall spacers and the first material layer.

Next, a second hard mask material 118 is formed over the workpiece 102, e.g., over the first sidewall spacers 108 and the first material layer 112, as shown in FIG. 7, which shows a cross-sectional view of the semiconductor device shown in FIG. 6 in a view perpendicular to the view shown in FIG. 5. A photosensitive material 120 is formed over the second hard mask material 118. The second hard mask material 118 may comprise similar materials or dimensions as were described for the first hard mask material 104, for example. The second hard mask material 118 may comprise substantially the same material and dimensions used for the first hard mask material 104, although alternatively, the second hard mask material 118 may comprise a different material or dimension than the first hard mask material 104, for example.

In embodiments wherein the first hard mask 104 comprises an oxide material, the first sidewall spacers 108 comprise a nitride material, and the first material layer 112 comprises an oxide material, the second hard mask material 118 may comprise an oxide material, for example. The oxide material of the second hard mask material 118 may comprise a different composition than the composition of the oxide material of the first material layer 112, to provide etch selectivity of the second hard mask material 118 to the first material layer 112, for example.

The second hard mask material 118 is also referred to herein as a third sacrificial material, for example. The second hard mask material 118 preferably comprises a material that is adapted to be etched selective to the material of the first material layer 112, the first sidewall spacers 108, and to the material of subsequently formed second sidewall spacers 122 (see FIG. 8), for example.

The layer of photosensitive material 120 may comprise a photoresist, for example. An anti-reflective coating (ARC), not shown, may be formed over the second hard mask material 118 before depositing the layer of photosensitive material 120, for example. The layer of photosensitive material 120 is patterned with a second pattern for a plurality of lines extending in a second direction in a top view of the workpiece 102, e.g., in the x direction shown in FIG. 9. The plurality of lines of the second pattern may each comprise a minimum feature size of a lithography system, lithography process, or of the layer of photosensitive material 120, as examples, although alternatively, the plurality of lines of the second pattern may comprise other dimensions, for example. The lines of the second pattern may comprise a width of about 32 to 50 nm in some applications, for example, although the width of the lines may be larger or smaller, for example.

The layer of photosensitive material 120 may be patterned using a second lithography mask (not shown), by transferring a pattern in the second lithography mask to the layer of photosensitive material 120 by exposing the layer of photosensitive material 120 to energy passed through or reflected from the second lithography mask, for example. Alternatively, the layer of photosensitive material 120 may be patterned using a direct patterning method.

Figure 8:
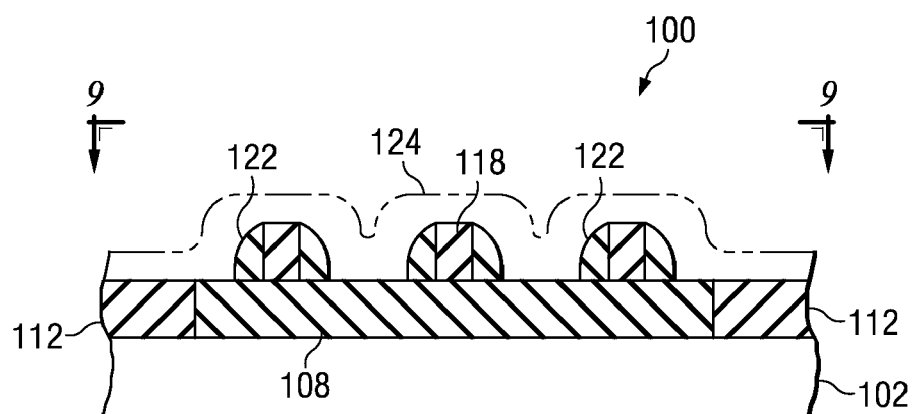
FIG. 8 shows a cross-sectional view of the semiconductor device shown in FIG. 7 after the second hard mask material has been patterned to form a second hard mask and after second sidewall spacers have been formed on sidewalls of the second hard mask.

The layer of photosensitive material 120 is used as an etch mask to pattern the second hard mask material 118, and the layer of photosensitive material 120 is then removed, leaving the patterned second hard mask 118 shown in FIG. 8 in a cross-sectional view. The width of the lines extending in the second direction in a top view of the patterned second hard mask 118 may comprise about 100 nm or less, for example, although alternatively, the width of the lines may comprise other dimensions. The lines may extend in the x direction in a top view of the workpiece 102 (not shown in FIG. 8; see FIG. 9) by about several hundred nm to several µm, depending on the semiconductor device 100 design, for example, although alternatively, the lines of the patterned second hard mask 118 may comprise other dimensions.

Next, a second sidewall spacer material 122 is formed over the patterned second hard mask 118, as shown in FIG. 8 in phantom at 124. The second sidewall spacer material 122 is also referred to herein as a fourth sacrificial material, for example. The second sidewall spacer material 122 may comprise similar materials and dimensions as were described for the first sidewall spacer material 108, for example. The second sidewall spacer material 122 preferably comprises a material that is adapted to be etched selective to the material of the first sidewall spacers 108, the first material 112, and the material of the second hard mask 118 at the top surface of the second hard mask 118, for example.

In embodiments wherein the first hard mask 104 comprises an oxide material, the first sidewall spacers 108 comprise a nitride material, the first material layer 112 comprises an oxide material, and the second hard mask material 118 comprises an oxide material, the second sidewall spacer material 122 may comprise a nitride material, for example. The nitride material of the second hard mask material 118 may comprise a different composition than the composition of the nitride material of the first sidewall spacers 108, to provide etch selectivity of the second sidewall spacer material 122 to the first sidewall spacers 108, for example.

The second sidewall spacer material 122 after the deposition of the second sidewall spacer material may comprise a top surface shown in phantom at 124, for example. The second sidewall spacer material 122 may be substantially conformal as-deposited, as shown in phantom at 124, in some embodiments. Alternatively, the second sidewall spacer material 122 may completely cover the spaces between the patterned second hard mask 118 and may extend over the top surface of the second hard mask 118, for example, not shown, in other embodiments.

The second sidewall spacer material 122 is etched using an etch process similar to the etch process 110 shown in FIG. 2, for example, forming second sidewall spacers 122 on sidewalls of the second hard mask 118, as shown in FIG. 8. The etch process may comprise a directional or anisotropic etch process adapted to preferentially remove the second sidewall spacer material 122 from top surfaces of the second hard mask 118, the first material layer 112, and the first sidewall spacers 108, yet leave a portion of the second sidewall spacer material 122 on sidewalls of the second hard mask 118, forming the second sidewall spacers 122, for example.

The sides of the second sidewall spacers 122 slope downwardly away from the top surface of the second hard mask 118 due to the etch process, wherein the bottom of the second sidewall spacers 122 is slightly wider than the top of the second sidewall spacers 122. The second sidewall spacers 122 may comprise a width of about 100 nm or less, and may comprise a width of about 50 nm or less in some embodiments, although alternatively, the second sidewall spacers 122 may comprise other dimensions. The second sidewall spacers 122 may comprise a width of less than about 32 nm in some embodiments, for example.

The second sidewall spacers 122 may comprise the same width as the first sidewall spacers 108 in some embodiments, for example. Square patterns 136 for features 140 are formed in an array in these embodiments, as shown in a top view in FIG. 16. Alternatively, the second sidewall spacers 122 may comprise a different width than the first sidewall spacers 108. Rectangular patterns 136 for features 140 are formed in an array in these embodiments, not shown in the drawings.

Figure 9:
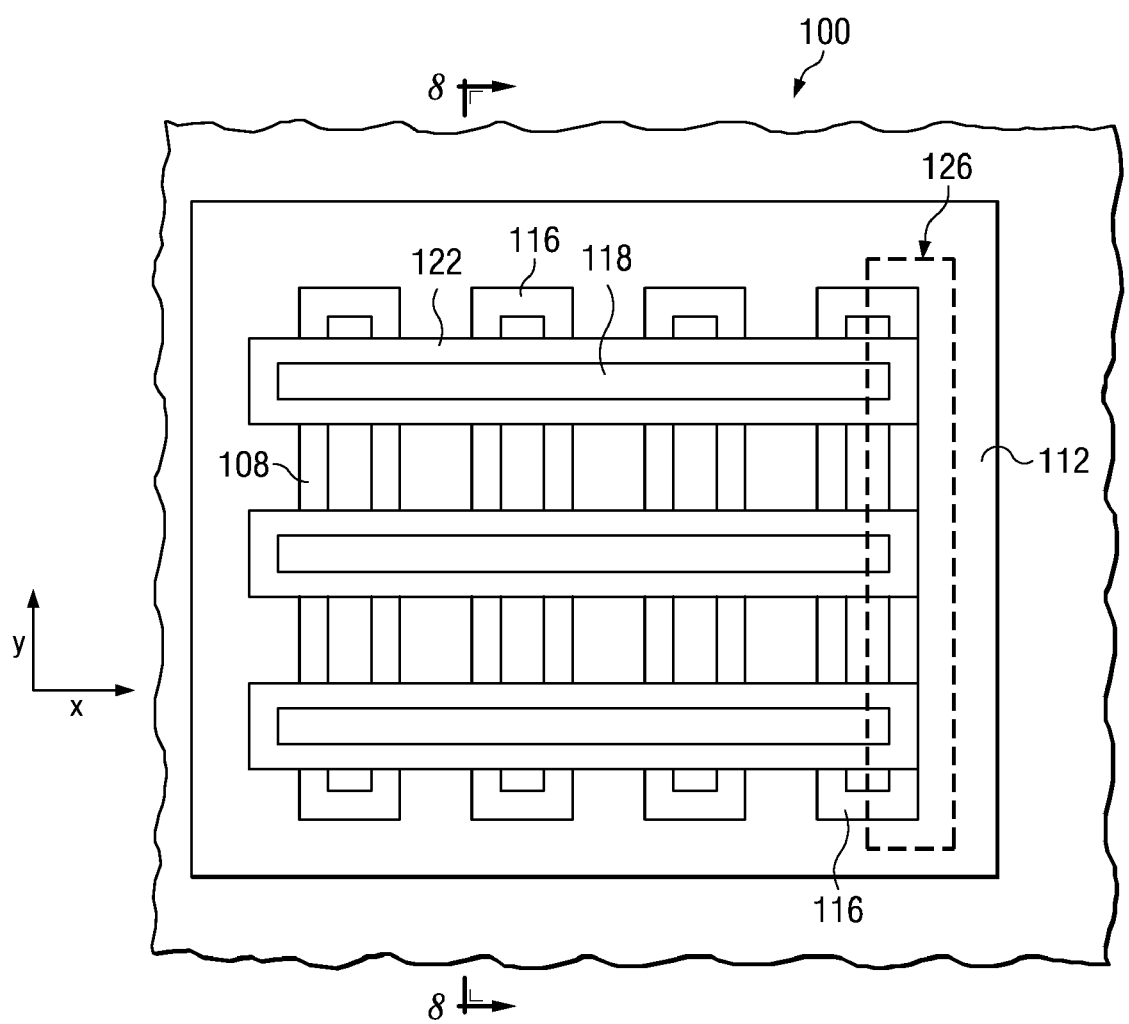
FIG. 9 shows a top view of the semiconductor device shown in FIG. 8.

FIG. 9 shows a top view of the semiconductor device 100 shown in FIG. 8. The second hard mask 118 comprises the shape of a plurality of lines that extend in a second direction, e.g., in the x direction, wherein the second direction is different from the first direction. The second direction may be substantially perpendicular to the first direction in some embodiments, for example. Alternatively, the second direction may not be perpendicular to the first direction, for example, but rather, the second direction may be positioned at angles other than ninety degrees to the first direction. The second sidewall spacers 122 comprise a ring-shaped spacer material disposed around each of the lines of the patterned second hard mask 118.

Note that in some regions 126 of the semiconductor device 100, ends of the second sidewall spacers 122 may extend over an extended line of the first sidewall spacers 108, e.g., in region 126. An optional trim mask may be used to pattern the second sidewall spacers 122 to remove them from over the extended line of the first sidewall spacers 108 in regions 126, for example, in some embodiments, to be described further herein.

Figure 10:
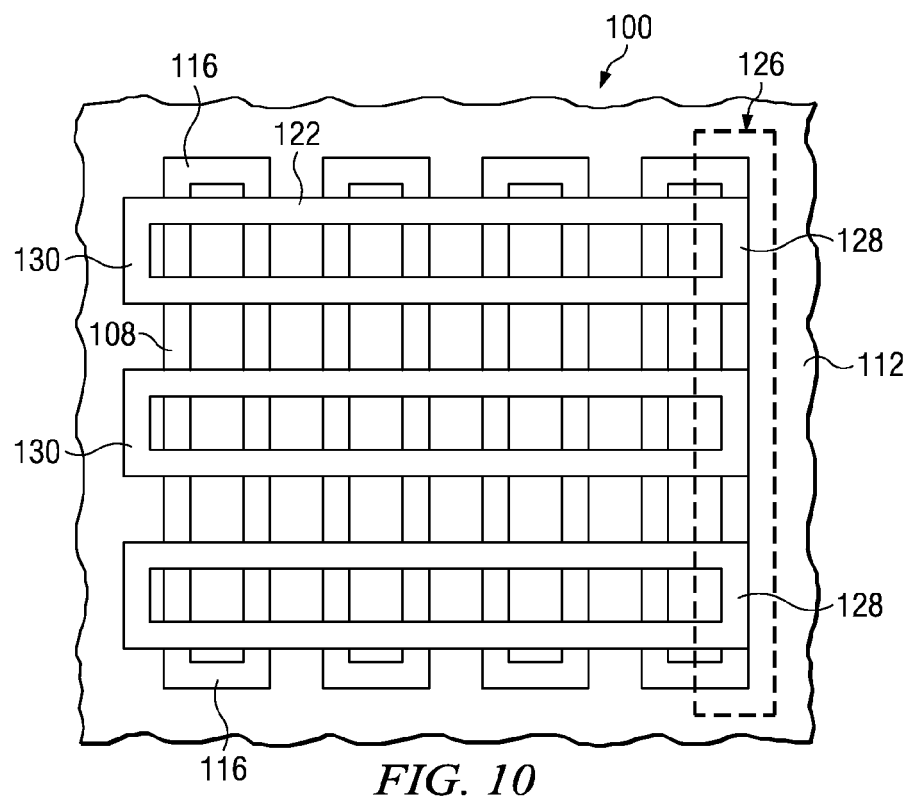
FIG. 10 shows a top view of the semiconductor device shown in FIG. 9 after the removal of the second hard mask.

Next, the second hard mask 118 is removed using an etch process, leaving the semiconductor device 100 structure shown in FIG. 10. The second sidewall spacers 122 in the shape of a ring are left remaining over the first sidewall spacers 108 and the first material layer 112. Advantageously, the ends 116 of the ring-shaped first sidewall spacers 108 are exposed and are not covered by the second sidewall spacers 122.

However, in the embodiment shown in FIG. 10, the ends 128 of the ring-shaped second sidewall spacers 122 on the right side are disposed over the right-most first sidewall spacer 108, which may be undesirable in some embodiments. This may be avoided by designing the second lithography mask used to pattern the second hard mask 118 so that the ends of the second hard mask 118 lines are extended more towards the right side, so that the ends 128 of the second sidewall spacers 122 are formed more to the right of the semiconductor device 100, not overlying the first sidewall spacer 108 material. Alternatively, a third lithography mask and lithography process may be used to remove the undesired ends 128 of the second sidewall spacers 122 from over the first sidewall spacer 108 material at edges of the region of the semiconductor device 100 being patterned, e.g., which may comprise an array region.

Figure 11:
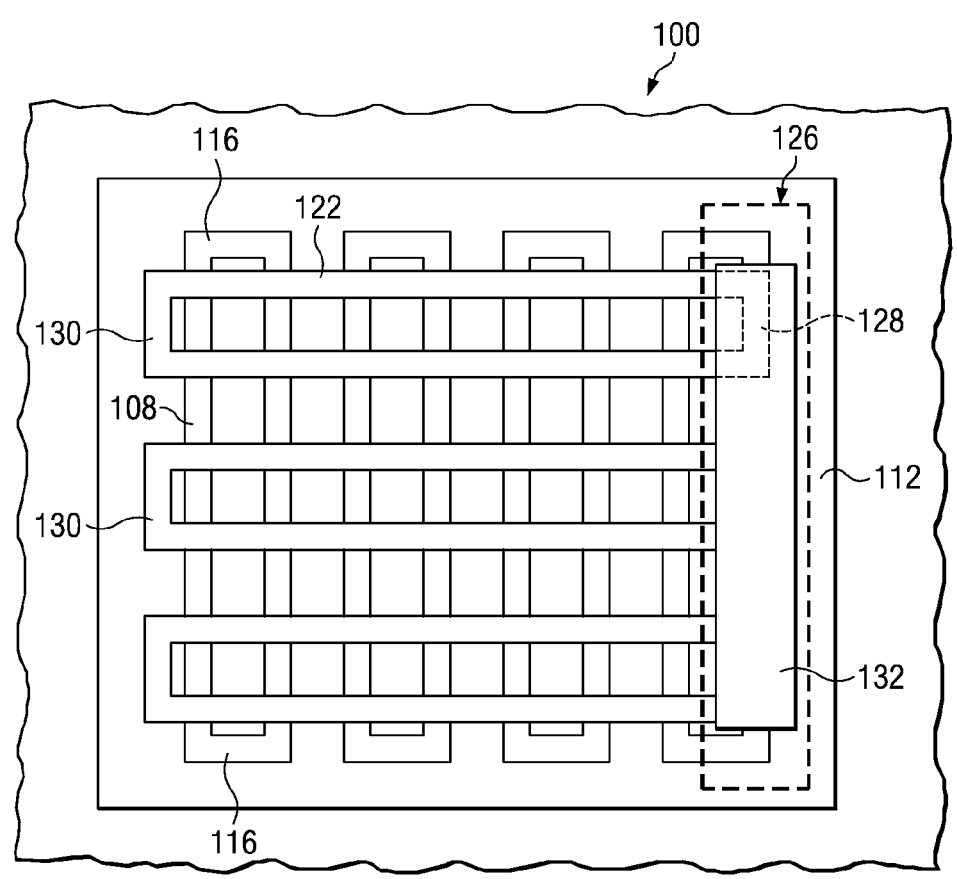
FIG. 11 shows a top view of the semiconductor device shown in FIG. 10, illustrating the shape of a pattern on an optional trim mask that may be used to remove the second sidewall spacers from over portions of the first sidewall spacers.

FIG. 11 shows a top view of the semiconductor device 100 shown in FIG. 10, illustrating the shape of a pattern 132 on an optional trim mask that may be used to remove the ends 128 of second sidewall spacers 122 from over portions of the first sidewall spacers 108. The pattern 132 comprises a rectangular pattern that extends over the ends 128 of the ring-shaped second sidewall spacers 122 in region 126.

Figure 12:
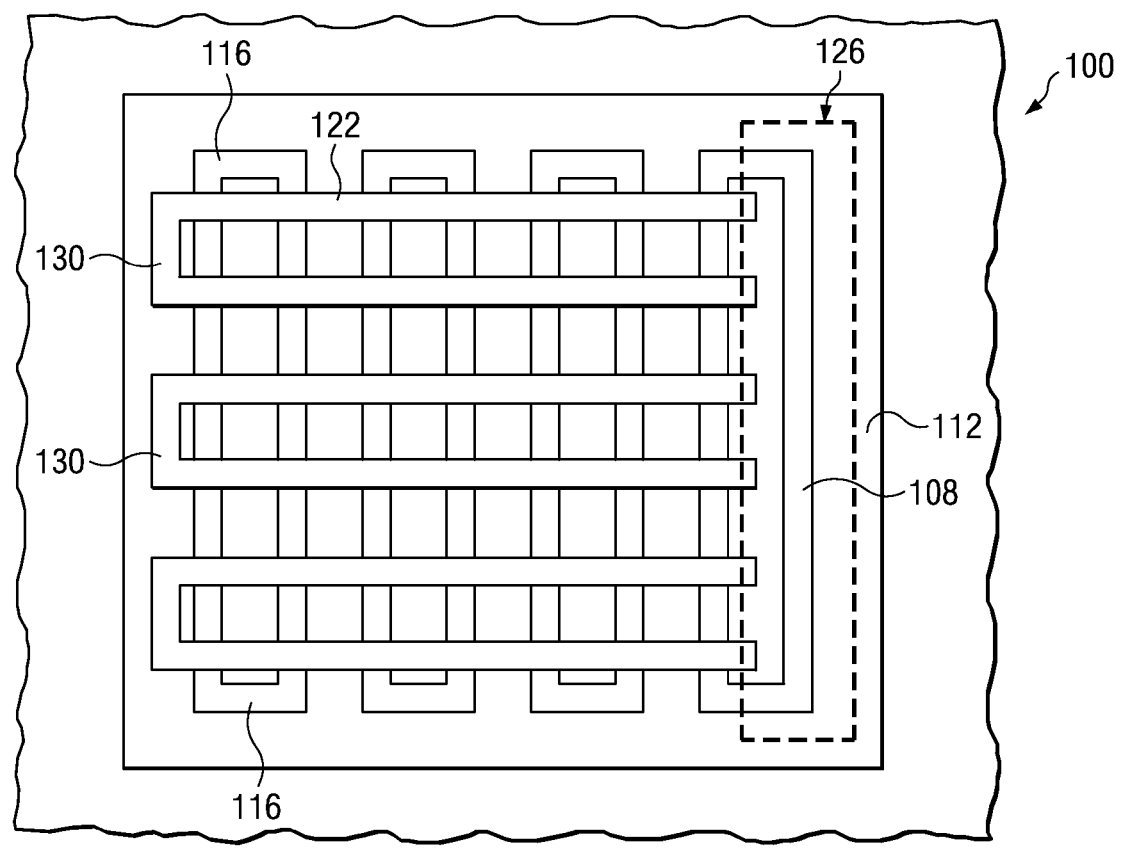
FIG. 12 shows the semiconductor device of FIG. 11 in a top view, after the optional trim mask, a lithography process, and an etch process have been used to remove the second sidewall spacers from over portions of the first sidewall spacers.

FIG. 12 shows the semiconductor device 100 of FIG. 11 in a top view, after an optional trim mask and lithography step are used to remove the second sidewall spacers 122 from over portions of the first sidewall spacers 108. To remove the unwanted second sidewall spacer 122 material, a layer of photosensitive material (not shown) may be formed over the workpiece 102, e.g., over the patterned second sidewall spacers 122, the first material layer 112 and the first sidewall spacers 108. The layer of photosensitive material is patterned using the trim mask (or alternatively, direct patterning may also be used to pattern the layer of photosensitive material), and the layer of photosensitive material is used as an etch mask while portions of the second sidewall spacers 122 are etched away. The layer of photosensitive material is removed, leaving the semiconductor device 100 structure shown in FIG. 12.

In the embodiment shown in FIGS. 1 through 17, without the use of the optional trim mask (or a direct patterning process) to remove the unwanted portions of the second sidewall spacer 122 material, contacts would not be formed on the right-most edge of the array, because the second sidewall spacer 122 in region 126 would block the patterning of the first sidewall spacer 108 in a subsequent etch step using the second sidewall spacer 122 as an etch mask. Rather, without the use of the optional trim mask, a feature comprising a continuous line (e.g., comprising the shape of the first sidewall spacer 108 on the right side) would be formed on the semiconductor device 100 because the second sidewall spacer 122 ends 128 would protect the first sidewall spacer 108 material on the right side during the patterning of the first sidewall spacer 108 material, not shown, which may be undesirable in some applications.

Note that the ends 130 of the second sidewall spacers 122 do not reside over a portion of the first sidewall spacers 108, advantageously. Thus, the ends 130 opposite the ends 128 of the second sidewall spacers 122 may be left remaining in the structure. The second sidewall spacers 122 including the ends 130 thereof will be removed in a subsequent manufacturing step, to be described further herein.

After the removal of the second hard mask 118, shown in FIG. 10, or after the trim step using the optional trim mask or patterning process shown in FIGS. 11 and 12, an optional second RIE trim etch process may be used to reduce the thickness of the second sidewall spacers 122 on sidewalls of the second hard mask 118, for example. The width in a top view of the second sidewall spacers 122 may be decreased by about 10 nm or less in some embodiments using the optional second RIE trim etch process, for example. The optional second RIE trim etch process may comprise a timed etch process of a few seconds or minutes, for example. Because the second sidewall spacers 122 are used to define sides of features (see features 140 in FIG. 17) parallel to the second direction y, the second optional RIE trim etch process advantageously reduces the size of the second sidewall spacers 122, also reducing the size of features 140 patterned using the novel methods of embodiments of the present invention.

Figure 13:
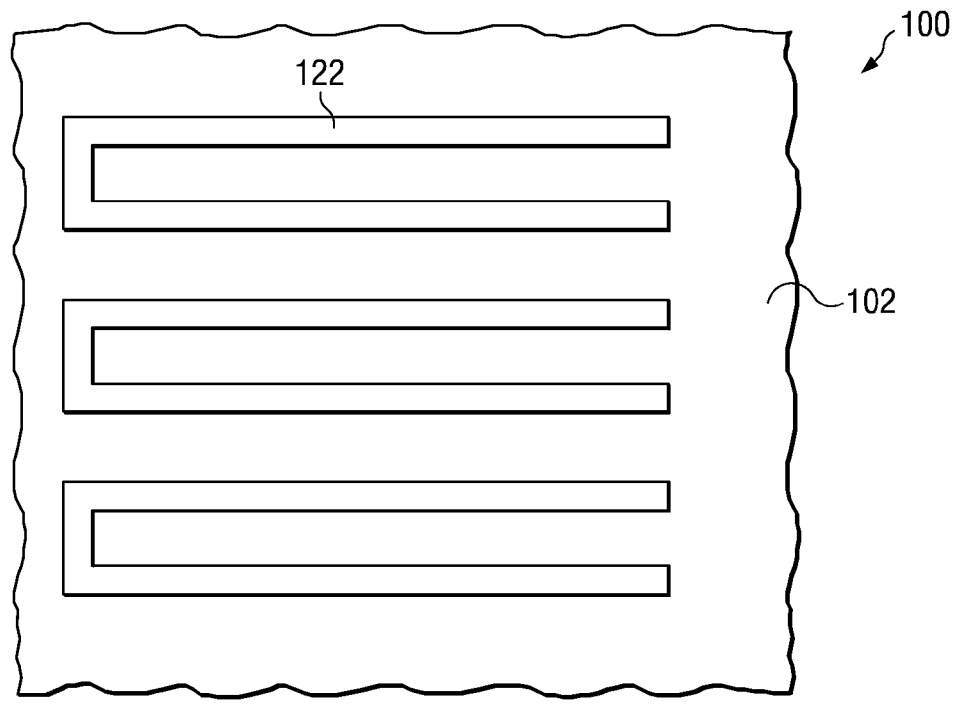
FIG. 13 shows a top view of the semiconductor device of FIG. 12 after the second sidewall spacers have been used as an etch mask to pattern the first sidewall spacers and the first material layer.

Next, the second sidewall spacers 122 are used as an etch mask to pattern the first sidewall spacers 108 and the first material layer 112, leaving the structure shown in FIG. 13. The etch process used to remove the exposed portions of the first sidewall spacers 108 and the first material layer 112 using the second sidewall spacers 122 as a mask may comprise an isotropic etch process, for example. The second sidewall spacers 122 are removed, as shown in FIG. 14, leaving the first material layer 112 and the first sidewall spacers 108 formed in a pattern of the second sidewall spacers 122 before the etch process, and exposing a top surface of the workpiece 102.

At this point, advantageously, the first sidewall spacer 108 material has been patterned with a pattern comprising a shape of the intersections of the first sidewall spacers 108 with the overlying second sidewall spacers 122, for example. The first sidewall spacer 108 material has been patterned with a pattern for a plurality of square features defined by the first and second sidewall spacers 108 and 122, wherein the first and second sidewall spacers 108 and 122 were defined by the first and second hard masks 104 and 118, respectively. The pattern formed in the first sidewall spacers 108 material is well-controlled and uniform across an array region, as shown.

Figure 14:
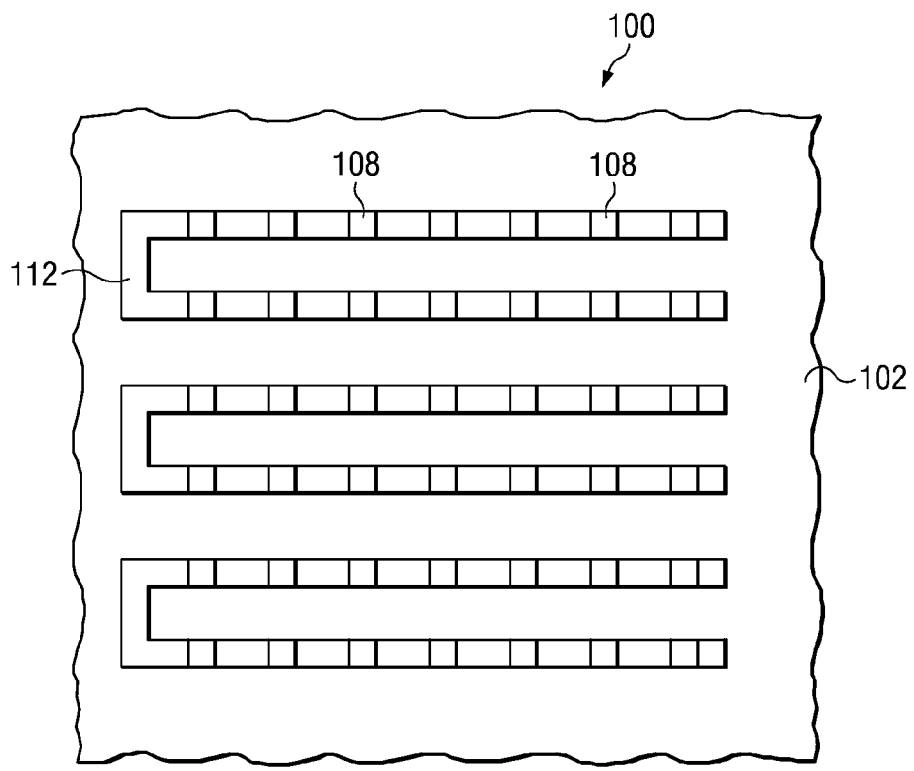
FIG. 14 shows a top view of the semiconductor device shown in FIG. 13 after the second sidewall spacers have been removed.

A further advantage of the semiconductor device 100 structure shown in FIG. 14 is the presence of the first material layer 112 disposed between adjacent squares of the first sidewall spacer 108 material. Without the presence of the first material layer 112 between the first sidewall spacer 108 material, the small patterned first material layer 112 may be weak and may possibly collapse. However, the first material layer 112 has been patterned in row-like shapes comprising the shape of the second sidewall spacers 122. The first material layer 112 is disposed between each patterned square-shaped portion of first sidewall spacer 108 material. The first material layer 112 adjacent and between the squares of the first sidewall spacer 108 material supports the first sidewall spacer 108 material, providing increased structural support and preventing collapse of the first sidewall spacer 108 material between processing steps, for example.

Figure 15:
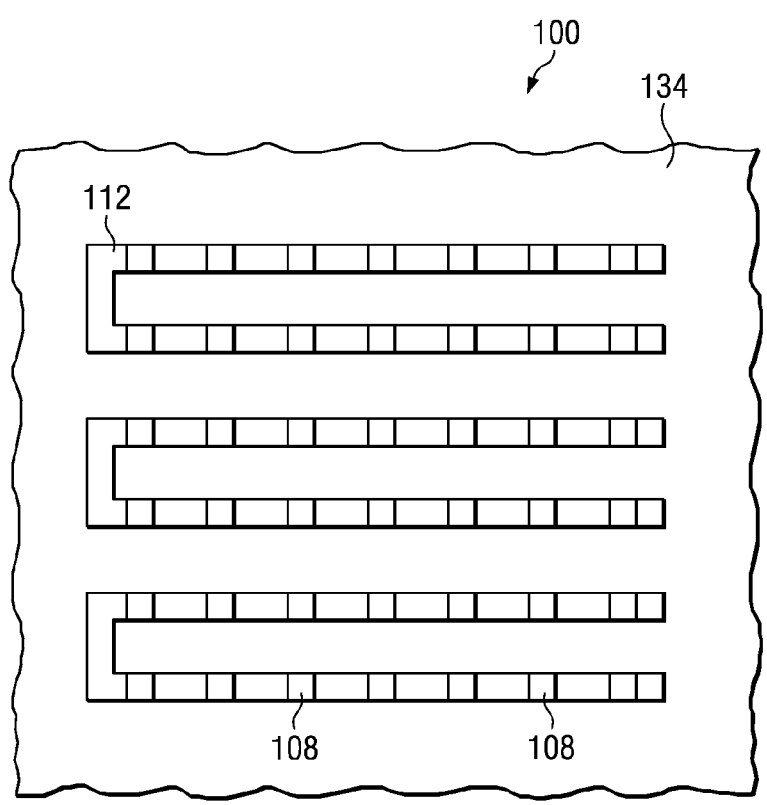
FIG. 15 shows a top view of the semiconductor device shown in FIG. 14, after a second material layer has been deposited over the workpiece between the patterned first sidewall spacers and first material layer.

Next, a second material layer 134 is deposited over the workpiece 102, e.g., over exposed portions of the workpiece 102 and the patterned first sidewall spacer 108, as shown in FIG. 15, and optionally also over the first material layer 112 as deposited. The second material layer 134 may comprise similar materials as were described for the first material layer 112, for example. The second material layer 134 may comprise at least one conductive material layer, at least one semiconductive material layer, at least one insulating material layer, or combinations or multiple layers thereof.

The second material layer 134 may be formed over the top surfaces of the first material layer 112 and the first sidewall spacer 108, and excess portions of the second material layer 134 may be removed using a planarization process similar to the process used to planarize the first material layer 112, for example. The second material layer 134 may comprise the same material as the first material layer 112 in some embodiments, or the second material layer 134 may comprise a different material than the first material layer 112, in other embodiments.

Figure 16:
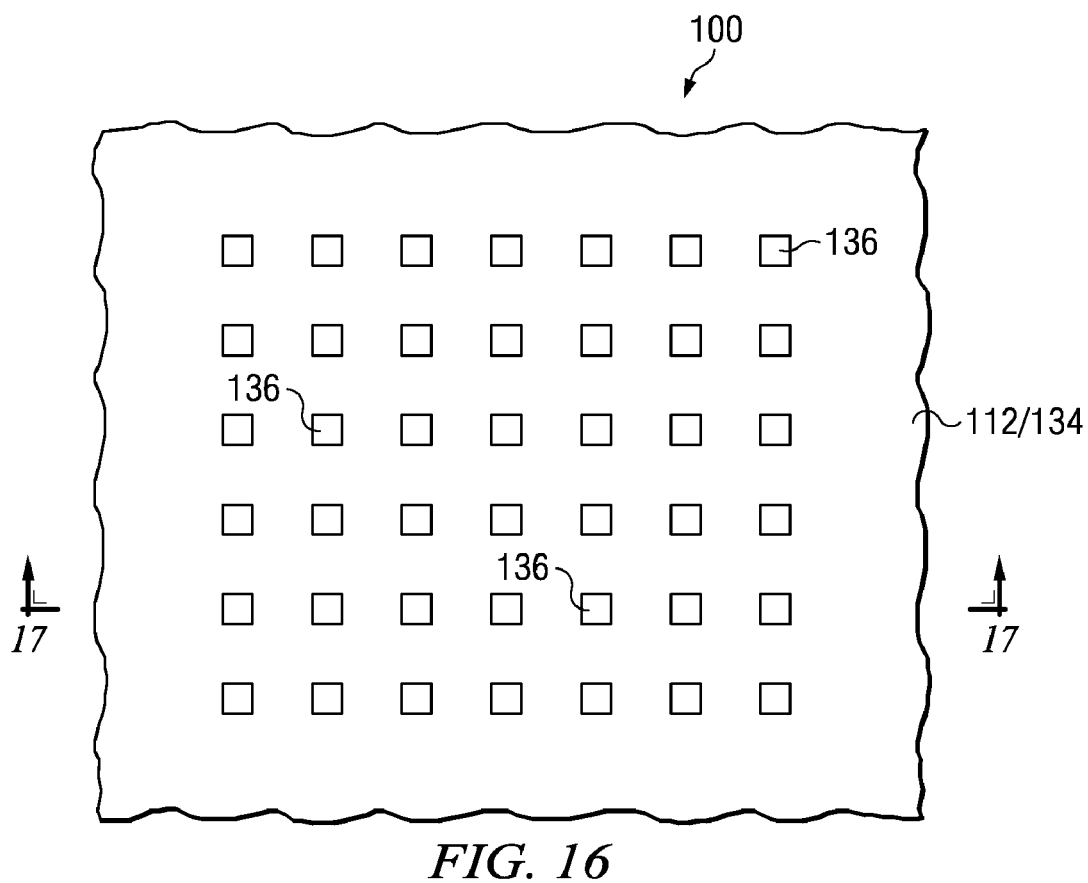
FIG. 16 shows a top view of the semiconductor device shown in FIG. 15 after the first sidewall spacers have been removed, leaving behind a pattern for a plurality of features formed within the first and second material layers.

The patterned first sidewall spacer 108 material is then removed, leaving a pattern 136 for a plurality of features 140 (see FIG. 17) formed within the first and second material layers 112 and 134. The pattern 136 for the plurality of features 140 may comprise a plurality of patterns for contacts, vias, or plugs in some embodiments, for example. FIG. 16 shows a top view of the semiconductor device 100 shown in FIG. 15 after the patterned first sidewall spacer 108 material has been removed, leaving behind the pattern 136 for the plurality of features 140 within the first and second material layers 112/134.

The pattern 136 may comprise an array of patterns 136 for vias, contacts, or plugs. For example, the pattern 136 may be a pattern for a plurality of vias or contacts that will be formed over an array of other features of the semiconductor device 100, such as an array of transistor gates, as one example. The transistor gate array may be formed in an underlying layer of polysilicon, for example, not shown. The features 140 formed from the pattern 136 may comprise conductive plugs of material that make electrical connection and carry current from subsequently formed conductive features to the transistor gates, for example.

An optional RIE trim etch process may be performed to remove a portion of the first and second material layers 112/134 from within the pattern 136 for the features 140, for example, not shown. The width in a top view of the pattern 136 for the features 140 may be increased by about 10 nm or less in some embodiments using the optional RIE trim etch process of the first and second material layers 112/134, for example. The optional RIE trim etch process may comprise a timed etch process of a few seconds or minutes, for example. The optional RIE trim etch process may smooth the sidewalls of the first and second material layers 112/134, for example.

Figure 17:
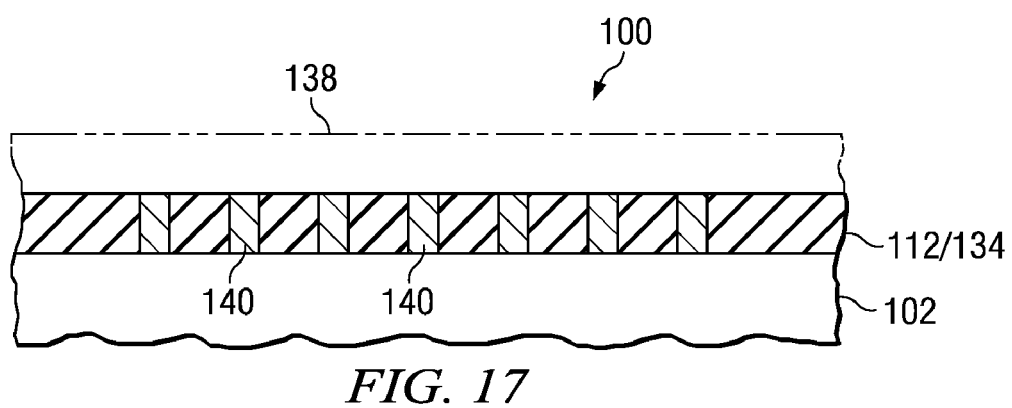
FIG. 17 shows a cross-sectional view of the semiconductor device shown in FIG. 16, after a third material is used to fill the patterns for the plurality of features in the first and second material layers, forming a plurality of features.

In some embodiments, the first and second material layers 112/134 are filled with a third material layer 140 to form features 140 within the patterns 136, as shown in FIG. 17. In other embodiments, the first and second material layers 112/134 are used to pattern an underlying material layer of the workpiece 102, for example, not shown in the drawings. The first and second material layers 112/134 may be left remaining over the workpiece 102, and the third material layer 140 may be deposited to fill the patterns in the underlying workpiece 102 and the first and second material layers 112/134, for example. Alternatively, the first and second material layers 112/134 may be removed from over the workpiece 102, and the patterns 136 transferred from the first and second material layers 112/134 to the workpiece 102 may be filled with the third material layer 140, also not shown.

Referring next to FIG. 17, the first and second material layers 112/134 may be left remaining in the structure. To form the features 140, a third material layer 140 is formed over the first and second material layers 112/134, filling the patterns 136 in the first and second material layers 112/134 and forming features 140 in the first and second material layers 112/134. The third material layer 140 may overfill the first and second material layers 112/134 and may comprise a top surface 138 as deposited, as shown. The third material layer 140 preferably comprises a different material than the first material layer 112 and/or the second material layer 134, for example. The third material layer 140 may comprise an insulating material, a semiconductive material, a conductive material, or multiple layers or combinations thereof, for example. The third material layer 140 may comprise at least one conductive material layer, at least one semiconductive material layer, at least one insulating material layer, or combinations or multiple layers thereof. The third material layer 140 may comprise at least one liner, at least one seed layer, at least one metal, at least one semiconductive material, or combinations thereof, as examples, in some embodiments.

In embodiments wherein the first and second material layers 112 and 134 comprise insulating materials, a single damascene or dual damascene process may be used to fill the patterns for the features, forming a plurality of features 140 of the semiconductor device 100, wherein the plurality of features 140 comprises conductive features. The conductive features may comprise contacts, vias, or plugs in some embodiments, for example. When the first and second material layers 112/134 are used as a hard mask to pattern an underlying material layer, the patterns 136 for features formed in the underlying material layer may also be filled using single or dual damascene processes, for example.

As an example, FIG. 17 shows a cross-sectional view of the semiconductor device 100 shown in FIG. 16, wherein a single damascene process is used to fill the patterns 136 in the first and second material layers 112/134 and form features 140. A third material layer 140 comprising a conductive material 140 is formed over the patterns 136 in the first and second material layers 112/134. The conductive material 140 may comprise copper, a copper alloy, aluminum, an aluminum alloy, tungsten, a tungsten alloy, one or more liner or seed layers, or combinations thereof, as examples, although alternatively, the conductive material 140 may comprise other materials. A CMP and/or etch process may be used to planarize the workpiece 102 top surface and remove excess portions of the conductive material 140 from over the first and second material layers 112/134, as shown.

In some embodiments, a CMP and/or etch process may not be used to planarize the workpiece 102 top surface after the deposition of the third material layer 140. Rather, the excess portions of the third material layer 140 may be patterned, e.g., with a conductive line or other feature pattern, leaving the third material layer 140 residing in at least some of the patterns 136, and forming conductive lines or other features disposed over the features 140 left remaining in the patterns 136, for example (not shown).

Alternatively, a dual damascene process may be used to fill the pattern for the features 136. For example, an insulating material layer may be disposed above or below the first and second material layers 112/136, wherein the insulating material layer is patterned with a pattern for conductive features such as conductive lines of the semiconductor device 100. The pattern for the conductive features and the pattern 136 in the first and second material layer 112/134 may be filled simultaneously with a conductive material to form the features 140 and the conductive features, for example. Alternatively, the first and second material layers 112/136 may comprise a hard mask that is used to pattern one portion of an insulating material layer with the pattern 136 for features 140, and a different lithography mask and process may be used to pattern a second portion of the insulating material layer with a pattern for conductive lines, for example.

Figure 18:
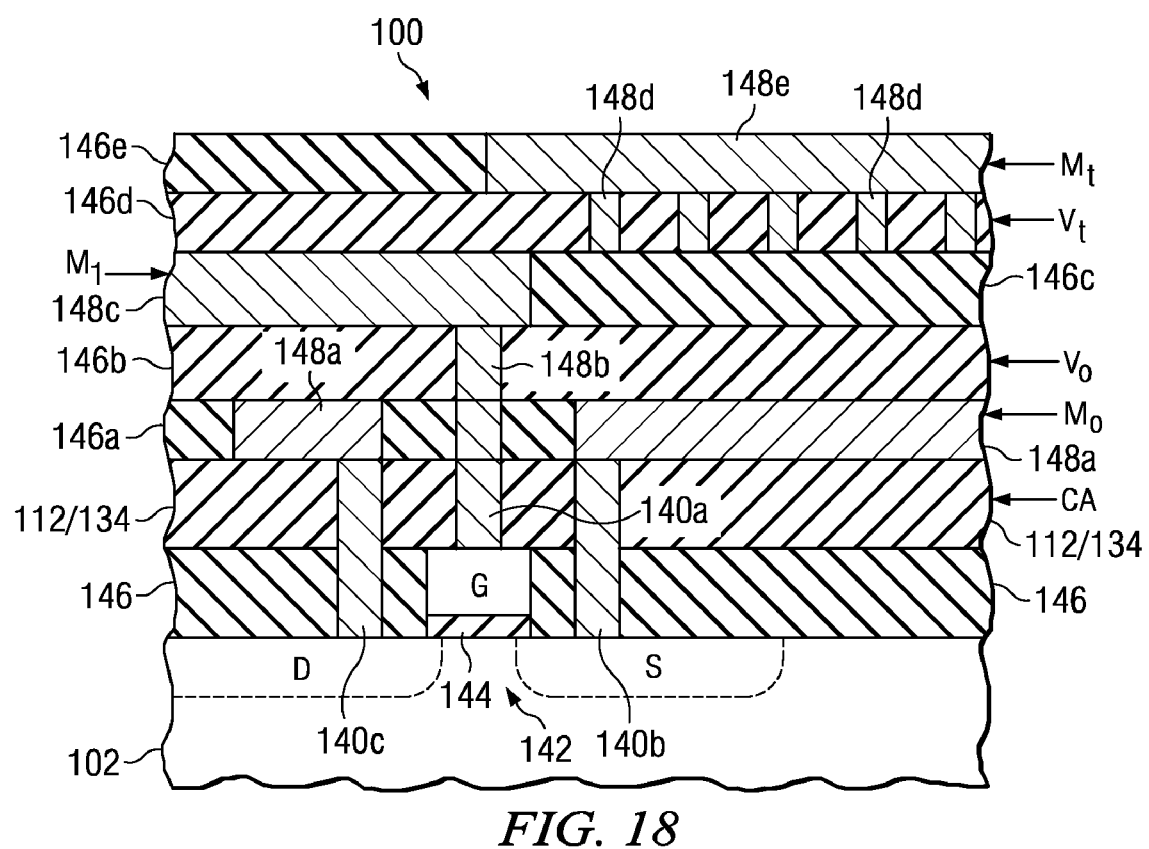
FIG. 18 shows an embodiment of the present invention, wherein the plurality of features formed comprise contacts that are coupled to a gate, source, and/or drain of a transistor.

In some embodiments, the features 140 preferably comprise a plurality of contacts or plugs that are used to make electrical connections to other elements formed on the semiconductor device 100. For example, FIG. 18 shows an embodiment of the present invention, wherein the plurality of features 140 formed in the first and second material layers 112/134 comprise contacts that are coupled to a gate G, source S, and/or drain D of a transistor 142. The features 140 of embodiments of the invention described herein may also be used to make electrical connections to other types of devices, for example, not shown.

The workpiece 102 in FIG. 18 includes one or more transistors 142 that comprise at least one source S and at least one drain D disposed on either side of a gate dielectric 144 and at least one gate G disposed over the gate dielectric 144. An insulating material layer 146 is formed around the one or more transistors 142. The first and second material layers 112/134 are formed as described herein with reference to FIGS. 1 through 17, having patterns 136 for features 140 formed therein using the novel four sacrificial materials 104, 108, 118, and 122 also described herein.

Contacts 140a, 140b, and 140c are formed within the first and second material layers 112/134, which may comprise a contact layer CA of the semiconductor device 100. Contact 140a is coupled to and makes electrical contact with the gate G. Contacts 140b and 140c are also formed within the insulating material layer 146, as shown, being coupled to and making electrical contact with the source S and drain D of the transistor 142, respectively. To form contacts 140b and 140c, after the first sidewall spacer 108 material is removed from within the first and second material layer 112/134, an overetch process may be used to form the patterns 136 within the first and second material layers 112/134 in the insulating material layer 146, transferring the patterns 136 to the insulating material layer 146 beneath the first and second material layers 112/134. The over-etch process may be adapted to stop on the material of the workpiece 102, for example.

Additional metallization layers $M_0$, $V_0$, $M_1$, $V_t$, and $M_t$ may be formed over the contact layer CA, as shown in FIG. 18, using single and/or dual damascene processes. For example, an insulating material layer 146a may be formed over the contact CA layer, and the insulating material layer 146a may be patterned with a pattern for conductive lines 148a that make electrical connection to the contacts 140a, 140b and 140c in the first and second material layers 112/134, as shown. A conductive material is then deposited to fill the patterns in the insulating material layer 146a, filling the patterns, and any excess conductive material is removed from the top surface of the insulating material layer 146a. Other vias 148b and 148d may be formed in via layers $V_0$ through $V_t$ in insulating material layers 146b and 146c, respectively, and other conductive lines 148c and 148e may be formed in conductive line layers $M_0$ through $M_t$ in insulating material layers 146c and 146e, respectively, as shown. There may be one or more metallization layers CA, $M_0$, $V_0$, through $V_t$ and $M_t$ formed in a semiconductor device 100 in accordance with embodiments of the present invention.

The novel feature 140 patterning methods may also be used to form an array of vias in a via level of a semiconductor device 100, for example. Vias 148d in via level $V_t$ shown in FIG. 18 may be formed in accordance with embodiments of the present invention, for example, wherein insulating material layer 146d is formed using the methods described with reference to the first and second material layers 112/134 shown in the previous figures, or wherein first and second material layers 112/134 formed using the methods described herein are used as a hard mask to pattern insulating material layer 146d. Vias 148d in via level $V_t$ may be formed from patterns 136 using a single damascene process, for example. Alternatively, conductive line 148e and vias 148d formed from patterns 136 may be formed in conductive line layer $M_t$ and via level $V_t$ simultaneously using a dual damascene process, as another example.

Lithography masks for patterning the novel patterns 136 for features 140 described herein may be designed by, first, developing a design for an array of features 140. The size of the features 140, the number of features 140, and spacing between the features 140 of the array may be determined, for example. The array may comprise six rows and seven columns of patterns 136 for features 140, as shown in FIG. 16 in a top view, although alternatively, the array of the patterns 136 for features 140 may comprise other numbers of columns and rows. The array may comprise dozens, hundreds or thousands of the patterns 136 for features 140, for example, not shown. A first lithography mask is designed having a pattern for a first hard mask 104 (see FIG. 4) in a location between every other column of patterns 136. A second lithography mask is designed having a pattern for a second hard mask 118 (see FIG. 9) in a location between every other row of patterns 136. The first hard mask 104 and the second hard mask 118 define the edges of the patterns 136 and the spacing between the patterns 136 for features 140, for example. To prevent unwanted columns (or rows, not shown in the drawings) of patterns 136 from being formed, an optional third lithography mask comprising a trim mask may be designed, e.g., having a pattern 132 shown in FIG. 11, for example. The optional trim mask (or a direct patterning process) may be used to remove a portion of the second sidewall material 122 in region 126, as previously described herein. The first lithography mask, the second lithography mask, and optionally, the third lithography mask are then manufactured and may be used to form the novel patterns 136 for features 140, as described herein.

Embodiments of the present invention include novel methods of forming features of semiconductor devices 100. Embodiments of the present invention also include semiconductor devices 100 patterned and manufactured in accordance with the methods described herein.

Advantages of embodiments of the present invention include providing novel methods of patterning features 140 of semiconductor devices 100. One set of sidewall spacers, e.g., first sidewall spacers 108, is used to define an edge of a plurality of features in an array. Another set of sidewall spacers, e.g., second sidewall spacers 122, is used to define an edge in a different direction of the plurality of features in the array. The sidewall spacers 108 and 122 are used as sacrificial material layers to define damascene patterns 136 in the first and second material layers 112/134 which are later filled to form the features 140. The features 140 are formed at intersecting regions of the previously formed first and second sidewall spacers 108 and 122.

The novel first and second sidewall spacers 108 and 122 that define the features 140 are defined by two additional sacrificial material layers, e.g., hard mask 104 and hard mask 118, respectively.

The first material layer 112 disposed between the patterned first sidewall spacer 108 material provides additional structural support. After etching and removing or stripping the second sidewall spacer 122 material, a plurality of squares (or rectangles, if the first and second sidewall spacers 108 and 122 comprise different dimensions) of the first sidewall spacer 108 material is formed, with thin first sidewall spacer 108 material comprising pillars of material embedded in the first material layer 112, which may comprise an oxide material. The first sidewall spacer 108 material embedded in the first material layer 112 provides a mechanically safe structure, preventing collapse of the thin pillars of the first sidewall spacer 108 material.

Because the patterns 136 are formed using sidewall spacers 108 and 122 rather than a lithography printing process, very small features 140 may be formed that may be less than a minimum feature size printable using a lithography system or process, for example. A minimum feature size of less than about 30 nm is advantageously achievable in accordance with embodiments of the present invention described herein. Sub-resolution features 140 comprising a sub-resolution pattern having a smaller dimension than the resolution limit of a lithography system may advantageously be formed using the novel patterning methods described herein.

An optional RIE bias etch may be used to size up the feature holes (e.g., patterns 136) before filling the holes to form the features 140, e.g., to make the sidewalls of the patterns 136 in the first and second material layers 112/134 smoother. Because the features 140 are formed in a grid or array, patterning dense and isolated features of a semiconductor device 100 is facilitated. Multiple pitch contacts may be fabricating using spacer patterning in accordance with the novel manufacturing process flows described herein.

An optional trim mask or direct patterning process may be used to remove portions of the second spacer material 122 in areas such as region 126 wherein without such removal, first sidewall spacer material 108 would be left remaining, preventing the formation of features 140 in region 126, for example. The optional trim mask may be used to trim unwanted features 140 or edges in the second sidewall spacers 122 that overly the first sidewall spacers 108.

Optional RIE etch processes may be used to reduce the size of the first and second sidewall spacers 108 and 122 after their formation, for example, further reducing the size of the features 140 formed.

Embodiments of the present invention are easily implementable in existing manufacturing process flows, lithography mask designs, and lithography tools and systems, with few additional processing steps being required for implementation of the invention, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of processing a semiconductor device, the method comprising:
    forming first sidewall spacers on a first hard mask;
    removing the first hard mask;
    forming a first material layer over the first sidewall spacers;
    forming a second hard mask over the first material layer and the first sidewall spacers;
    forming second sidewall spacers on the second hard mask;
    removing the second hard mask; and
    patterning at least the first sidewall spacers using the second sidewall spacers as a mask.

2. The method according to claim 1, wherein patterning at least the first sidewall spacers further comprises patterning the first material layer.

3. The method according to claim 2, further comprising forming a second material layer over at least the first material layer.

4. The method according to claim 1, further comprising removing the second sidewall spacers.

5. The method according to claim 4, further comprising forming a second material layer over at least the first sidewall spacers, and removing the first sidewall spacers.

6. The method according to claim 5, further comprising forming a third material layer over at least the first material layer.

7. The method according to claim 6, wherein forming the first material layer, the second material layer, or the third material layer comprises forming at least one conductive material layer, at least one semiconductive material layer, at least one insulating material layer, or combinations or multiple layers thereof.

8. The method according to claim 1, further comprising planarizing the first material layer after forming the first material layer over the first sidewall spacers.

9. A method of fabricating a semiconductor device, the method comprising:
forming a first sacrificial material over a workpiece;
patterning the first sacrificial material with a first pattern for a plurality of lines extending in a first direction;
forming a second sacrificial material on sidewalls of the first sacrificial material;
removing the first sacrificial material;
forming a first material layer over the second sacrificial material;
forming a third sacrificial material over the first sacrificial material and the first material layer;
patterning the third sacrificial material with a second pattern for a plurality of lines extending in a second direction, the second direction being different than the first direction;
forming a fourth sacrificial material on sidewalls of the third sacrificial material;
removing the third sacrificial material;
patterning the first material layer and the second sacrificial material using the fourth sacrificial material as an etch mask;
removing the fourth sacrificial material;
forming a second material layer over the first material layer and the second sacrificial material; and
removing the second sacrificial material.

10. The method according to claim 9, wherein removing the second sacrificial material comprises leaving a plurality of patterns for contacts, vias, or plugs remaining within the first material layer and the second material layer.

11. The method according to claim 10, further comprising depositing a conductive material over the first material layer and the second material layer, filling the plurality of patterns for the contacts, vias, or plugs within the first material layer with the conductive material.

12. The method according to claim 11, wherein the conductive material extends above a top surface of the first material layer and the second material layer, further comprising:
chemically-mechanically polishing or etching the conductive material, removing excess conductive material from the top surface of the first material layer and the second material layer and forming contacts, vias, or plugs within the plurality of patterns for the contacts, vias, or plugs; or
patterning the conductive material that extends above the top surface of the first material layer and the second material, forming conductive lines or features in the conductive material that extends above the top surface of the first material and leaving contacts, vias, or plugs left remaining within at least some of the plurality of patterns for the contacts, vias, or plugs.

13. The method according to claim 10, further comprising using the first material layer and the second material layer as a hard mask to pattern at least one underlying material layer of the workpiece, forming the plurality of patterns for the contacts, vias, or plugs within the at least one underlying material layer of the workpiece.

14. The method according to claim 9, wherein patterning the third sacrificial material with the second pattern for the plurality of lines extending in the second direction comprises patterning the third sacrificial material with the second pattern for the plurality of lines that extend in a second direction that is substantially perpendicular to the first direction.

15. The method according to claim 9, further comprising planarizing a top surface of the workpiece, after forming the second material layer, removing a portion of the second material layer from over the second sacrificial material.

16. The method according to claim 9, wherein forming the first material layer and forming the second material layer comprise forming an insulating material.

17. The method according to claim 9, further comprising a reactive ion etch (RIE) bias etch process of the second sacrificial material, after removing the first sacrificial material; a
RIE bias etch process of the fourth sacrificial material, after removing the third sacrificial material; or a reactive ion etch (RIE) bias etch process of the first material and the second material layer, after removing the second sacrificial material.

18. A method of patterning a plurality of features of a semiconductor device, the method comprising:
forming a first hard mask over a workpiece;
patterning the first hard mask with a first pattern for a plurality of lines extending in a first direction, the first hard mask comprising sidewalls;
forming first sidewall spacers over the sidewalls of the first hard mask;
removing the first hard mask;
forming a first insulating material over the first sidewall spacers;
forming a second hard mask over the first insulating material and the first sidewall spacers;
patterning the second hard mask with a second pattern for a plurality of lines extending in a second direction, the second direction being different than the first direction, the second hard mask comprising sidewalls;
forming second sidewall spacers over the sidewalls of the second hard mask;
removing the second hard mask;
patterning the first insulating material layer and the first sidewall spacers using the second sidewall spacers as an etch mask;
forming a second insulating material layer over the first insulating material layer and the first sidewall spacers; and
removing the first sidewall spacers, forming a pattern for the plurality of features within the first insulating material layer and the second insulating material layer.

19. The method according to claim 18, further comprising filling the pattern for the plurality of features with a conductive material, forming a plurality of features in the first insulating material layer and the second insulating material layer.

20. The method according to claim 19, wherein filling the pattern for the plurality of features comprises forming at least one liner, at least one seed layer, at least one metal, at least one semiconductive material, or combinations thereof.

21. The method according to claim 19, wherein providing the workpiece comprises providing a workpiece having at least one transistor formed thereon, the transistor comprising at least one source, at least one drain, and at least one gate, wherein forming the plurality of features comprises forming a plurality of contacts, wherein at least one of the plurality of contacts is coupled to the least one source, the at least one drain, or the at least one gate of the at least one transistor.

22. The method according to claim 19, wherein filling the pattern for the plurality of features comprises a single damascene process or a dual damascene process.

23. The method according to claim 18, wherein the method is performed using a lithography system, the lithography system having a resolution limit, and wherein forming the pattern for the plurality of features comprises forming a sub-resolution pattern, the sub-resolution pattern comprising a smaller dimension than the resolution limit of the lithography system.

24. The method according to claim 18, wherein forming the second sidewall spacers over the sidewalls of the second hard mask comprises forming the second sidewall spacers on ends of the plurality of lines extending in the second direction, further comprising removing the second sidewall spacers from at least one end of the plurality of lines extending in the second direction, before patterning the first insulating material layer and the first sidewall spacers using the second sidewall spacers as an etch mask.

\* \* \* \* \*